United States Patent
Chang et al.

(10) Patent No.: US 9,362,354 B1
(45) Date of Patent: Jun. 7, 2016

(54) TUNING GATE LENGTHS IN SEMICONDUCTOR DEVICE STRUCTURES

(71) Applicant: International Business Machines Corporation, Armonk, NY (US)

(72) Inventors: Josephine B. Chang, Mahopac, NY (US); Michael A. Guillorn, Yorktown Heights, NY (US); Isaac Lauer, Yorktown Heights, NY (US); Jeffrey W. Sleight, Ridgefield, CT (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 14/624,864

(22) Filed: Feb. 18, 2015

(51) Int. Cl.
| | |
|---|---|
| H01L 21/84 | (2006.01) |
| H01L 29/06 | (2006.01) |
| H01L 21/02 | (2006.01) |
| H01L 29/66 | (2006.01) |
| H01L 29/41 | (2006.01) |

(52) U.S. Cl.
CPC ...... *H01L 29/0673* (2013.01); *H01L 21/02603* (2013.01); *H01L 29/66439* (2013.01); *H01L 21/845* (2013.01); *H01L 29/0669* (2013.01); *H01L 29/413* (2013.01); *H01L 2221/67* (2013.01)

(58) Field of Classification Search
CPC ............. H01L 29/0673; H01L 21/02603; H01L 29/66439
USPC ........................................... 438/163
See application file for complete search history.

(56) References Cited

U.S. PATENT DOCUMENTS

| | | | |
|---|---|---|---|
| 7,588,977 B2 | 9/2009 | Suk et al. | |
| 7,892,945 B2 | 2/2011 | Bedell et al. | |
| 7,928,017 B2 | 4/2011 | Kim et al. | |
| 8,298,881 B2 * | 10/2012 | Sleight | B82Y 10/00 257/401 |
| 8,361,907 B2 | 1/2013 | Bangsaruntip et al. | |
| 8,367,492 B2 | 2/2013 | Chidambarrao et al. | |
| 8,384,065 B2 | 2/2013 | Bangsaruntip et al. | |
| 8,420,466 B2 * | 4/2013 | Mieno | H01L 29/788 257/314 |
| 8,422,273 B2 | 4/2013 | Chang et al. | |
| 2008/0135949 A1 | 6/2008 | Lo et al. | |
| 2011/0012090 A1 | 1/2011 | Singh et al. | |
| 2012/0007051 A1 * | 1/2012 | Bangsaruntip | B82Y 10/00 257/24 |
| 2013/0075797 A1 | 3/2013 | Okano | |

OTHER PUBLICATIONS

J. Zhu, et al., "Correlated SiGe Wires Shaped by Regular Step Bunches on Miscut Si(113) Substrates," Physical Review B, vol. 60, No. 15, Oct. 15, 1999, pp. 1-6.

* cited by examiner

*Primary Examiner* — Tod T Van Roy
*Assistant Examiner* — Vu A Vu
(74) *Attorney, Agent, or Firm* — Cantor Colburn LLP; Vazken Alexanian

(57) ABSTRACT

A method for tuning gate lengths in nanowire semiconductor device structures. The present invention tunes the gate length by having the suspension height of the nanowire channels altered. The first method alters the suspension height by offsetting the height of the nanowires while utilizing gates of similar tapered dimensions, such that the nanowires pass through the gate regions at different heights and result in different gate length nanowire transistor device structures. The second method alters the suspension height by offsetting the height of the steps that the gates of similar tapered dimensions are formed on, such that the nanowires pass through the gate regions at different heights, resulting in different gate length nanowire transistor device structures. Both methods facilitate a decrease in overall fabrication costs by allowing the same type of patterned gate stacks to be used in order to produce channels of various lengths.

15 Claims, 12 Drawing Sheets

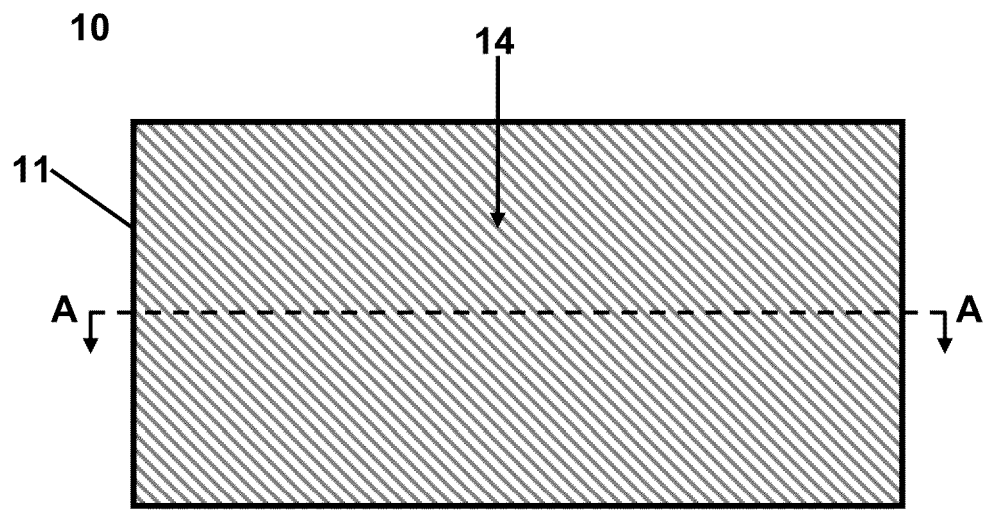
FIG. 1
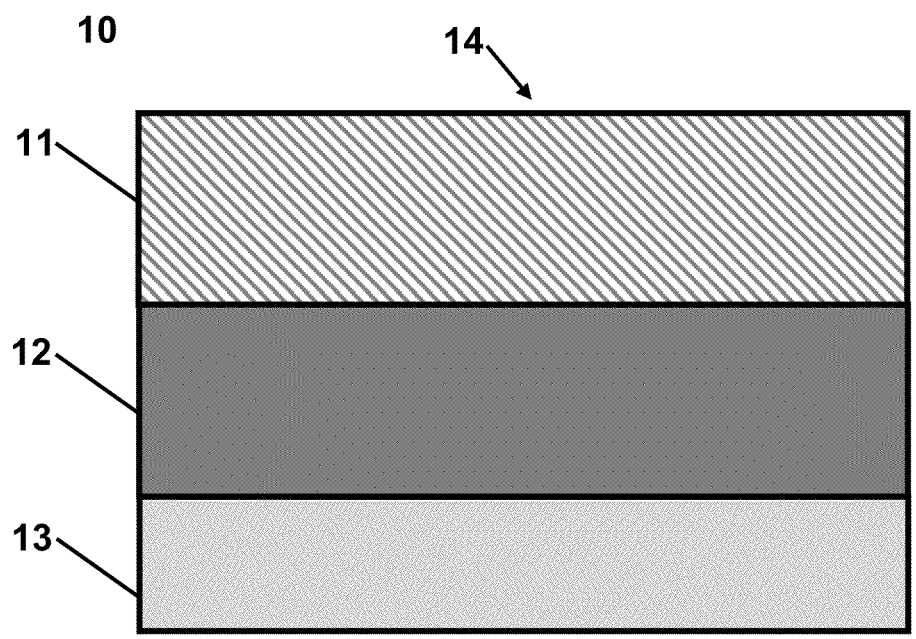
FIG. 1(A-A)

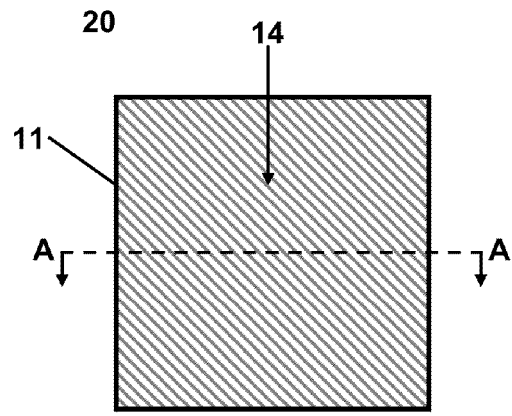
FIG. 2A
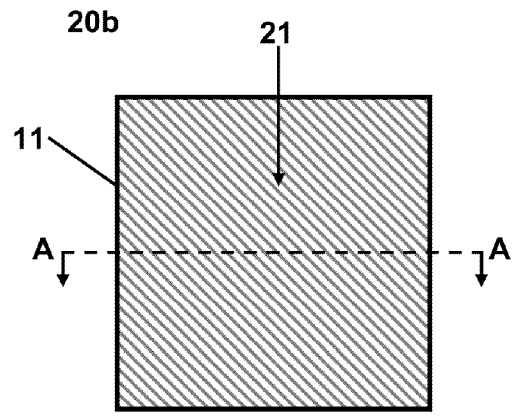
FIG. 2B
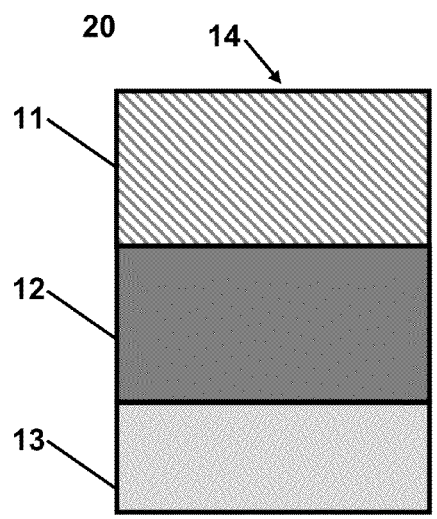
FIG. 2A(A-A)
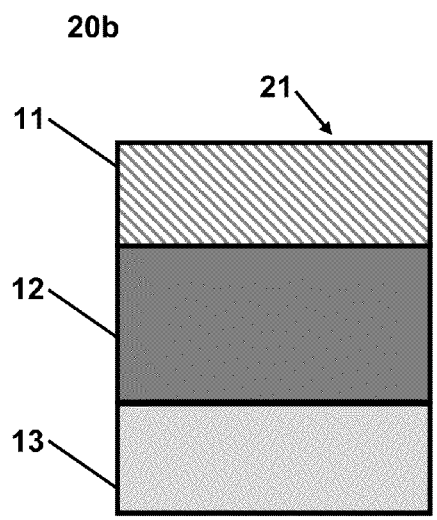
FIG. 2B(A-A)

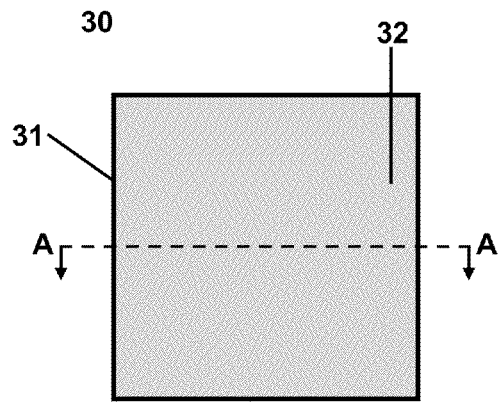
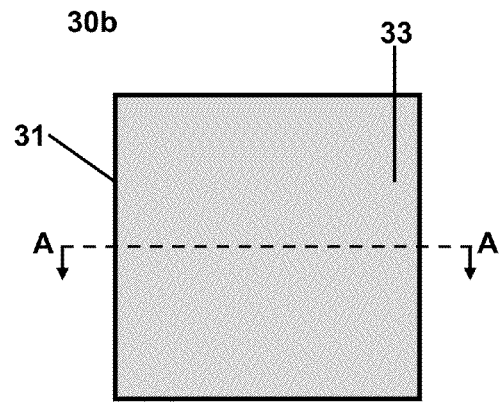
FIG. 3A
FIG. 3B
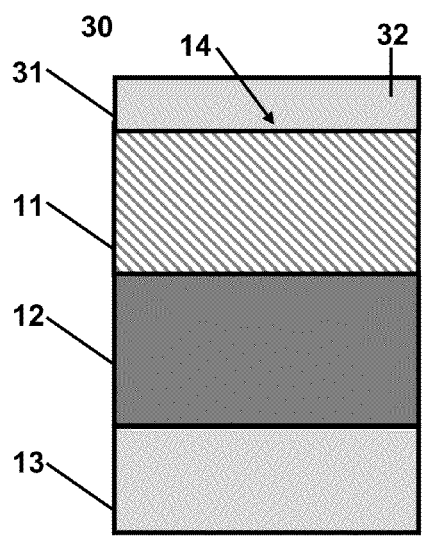
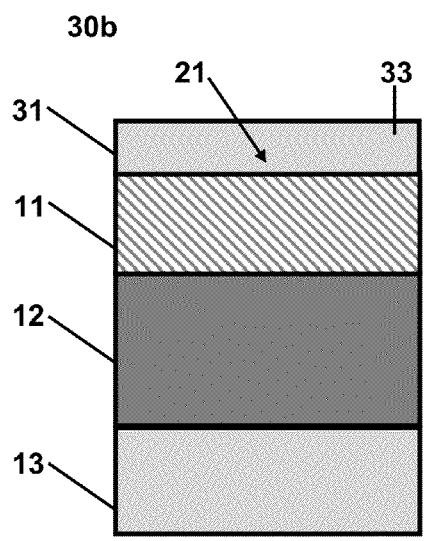
FIG. 3A(A-A)
FIG. 3B(A-A)

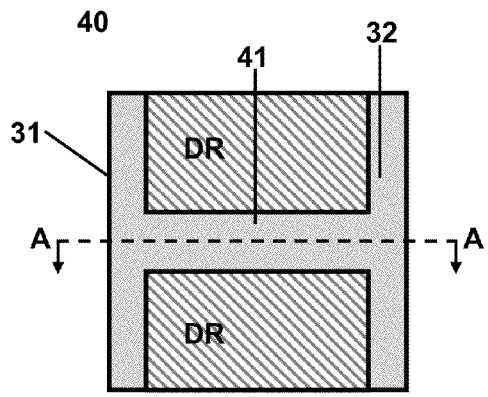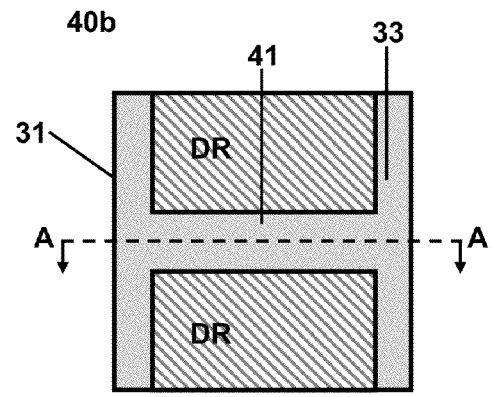
FIG. 4A             FIG. 4B
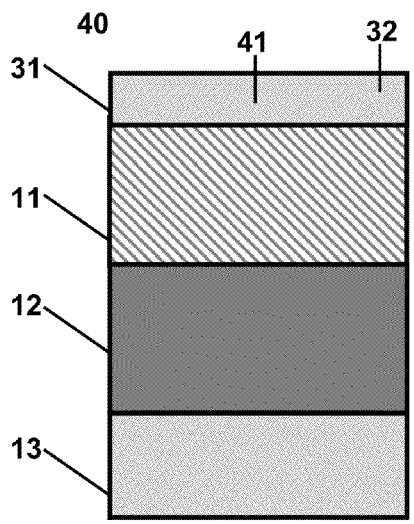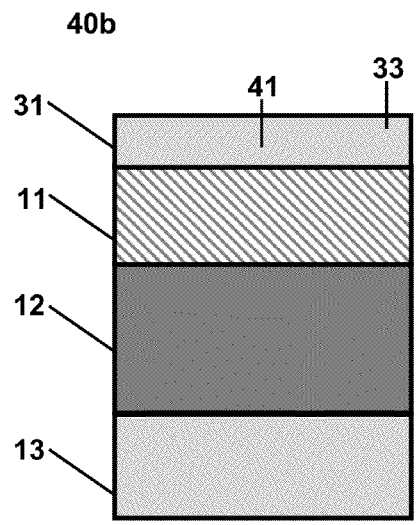
FIG. 4A(A-A)        FIG. 4B(A-A)

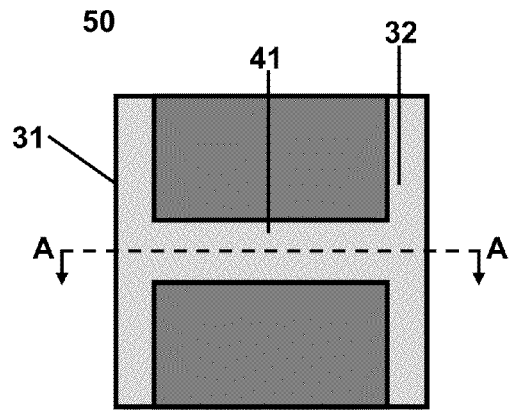
FIG. 5A
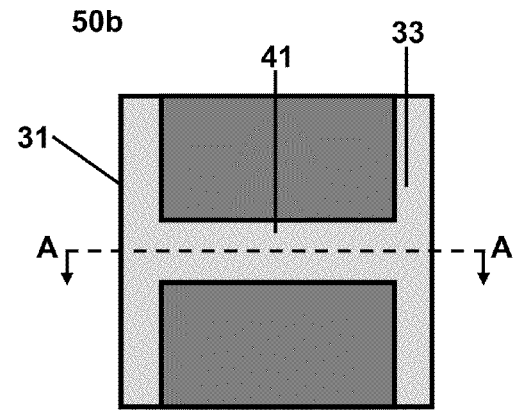
FIG. 5B
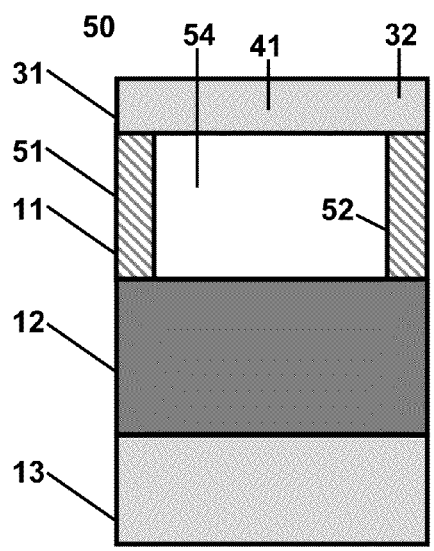
FIG. 5A(A-A)
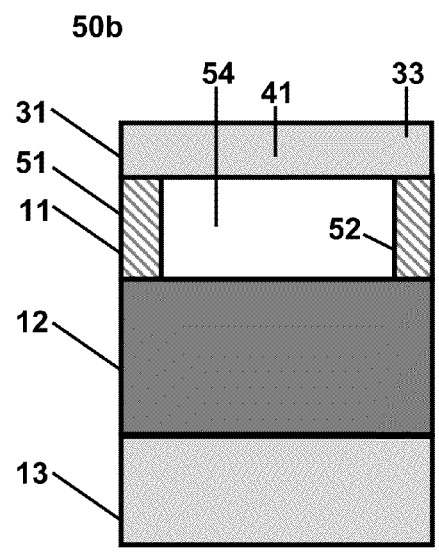
FIG. 5B(A-A)

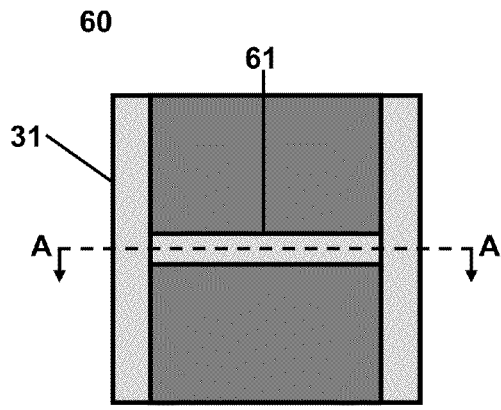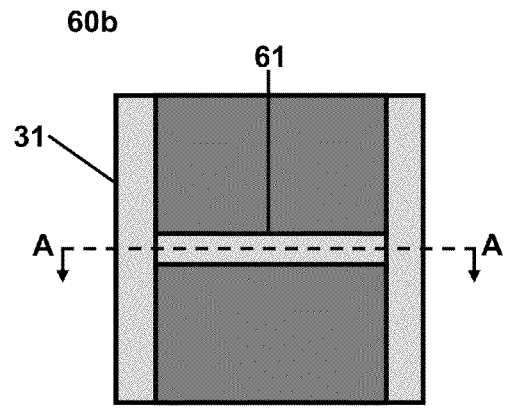
FIG. 6A  FIG. 6B
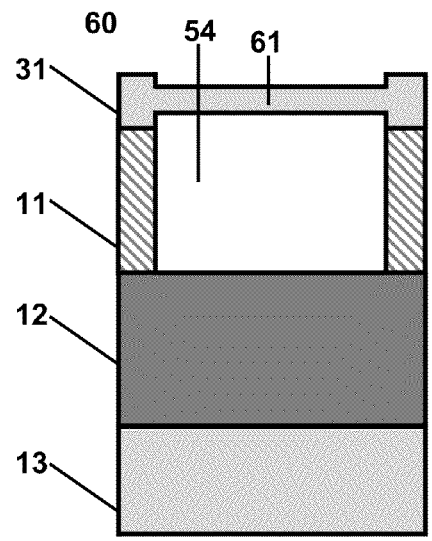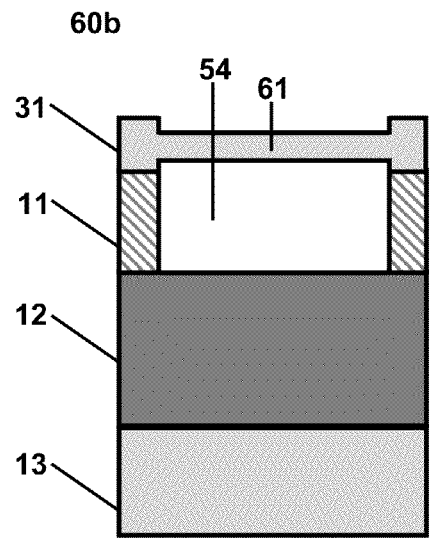
FIG. 6A(A-A)  FIG. 6B(A-A)

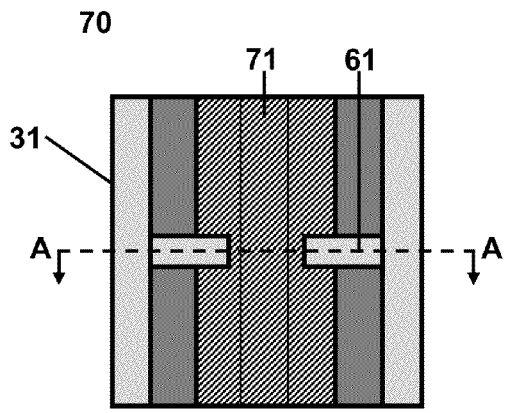
FIG. 7A
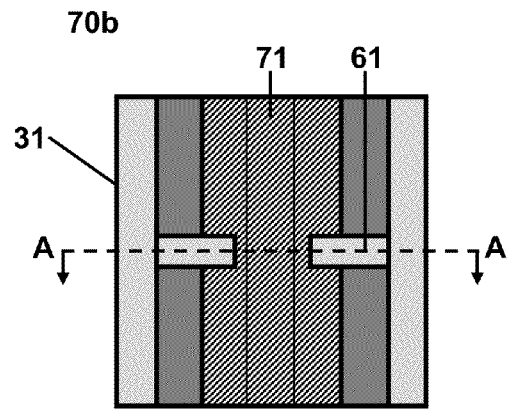
FIG. 7B
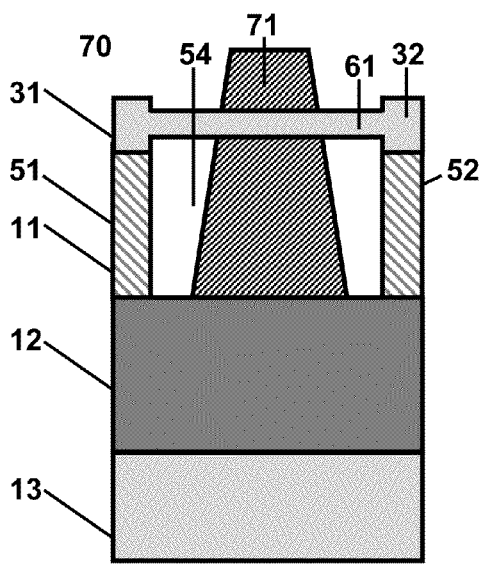
FIG. 7A(A-A)
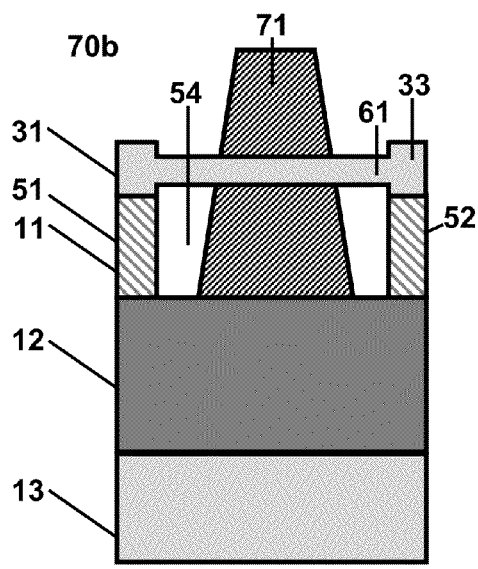
FIG. 7B(A-A)

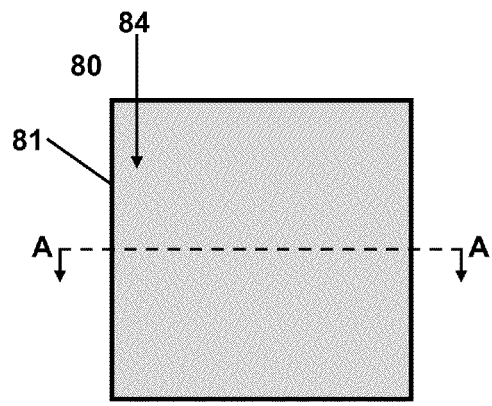
FIG. 8A
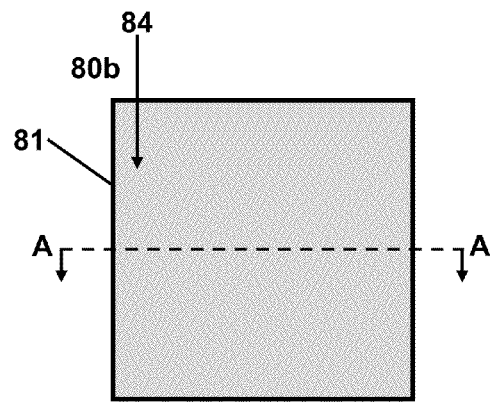
FIG. 8B
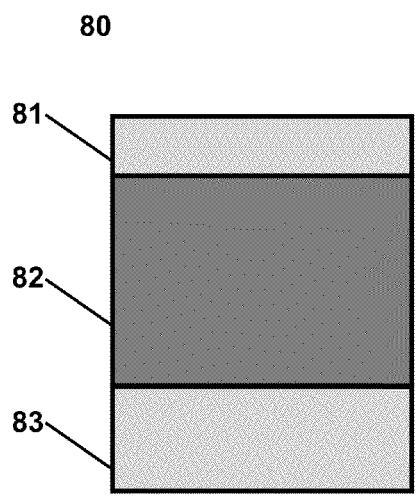
FIG. 8A(A-A)
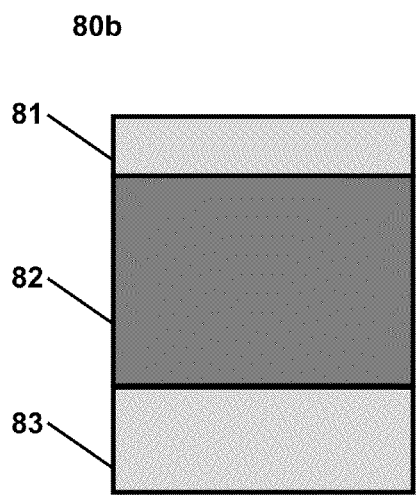
FIG. 8B(A-A)

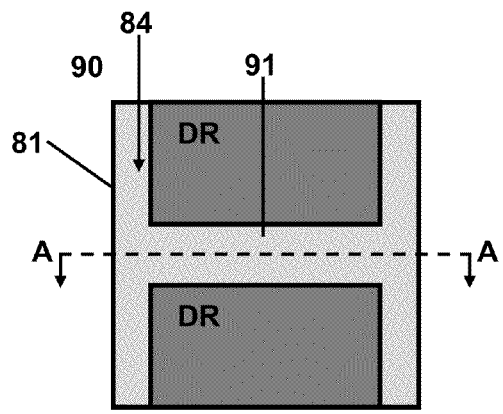
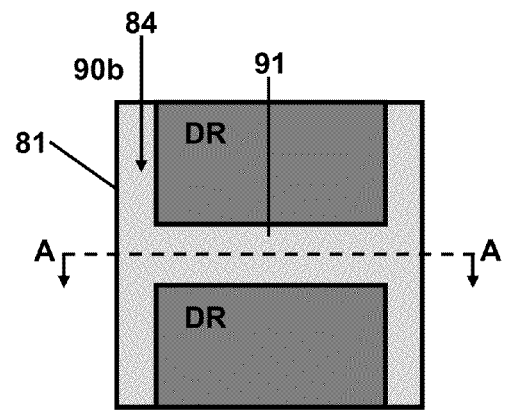
FIG. 9A
FIG. 9B
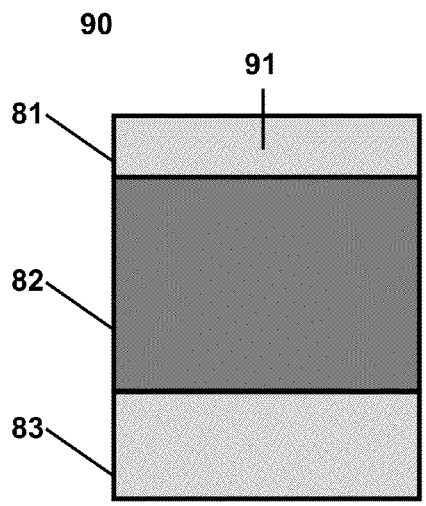
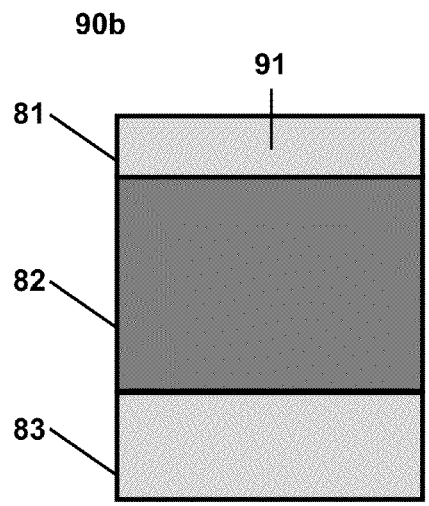
FIG. 9A(A-A)
FIG. 9B(A-A)

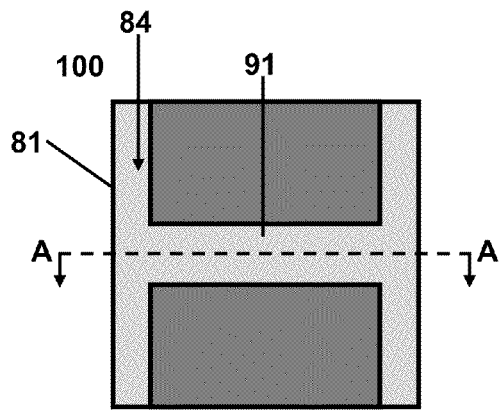
FIG. 10A
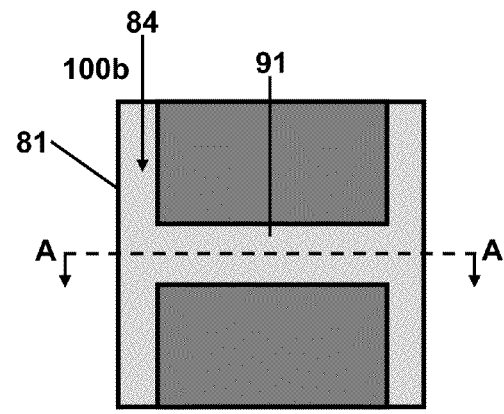
FIG. 10B
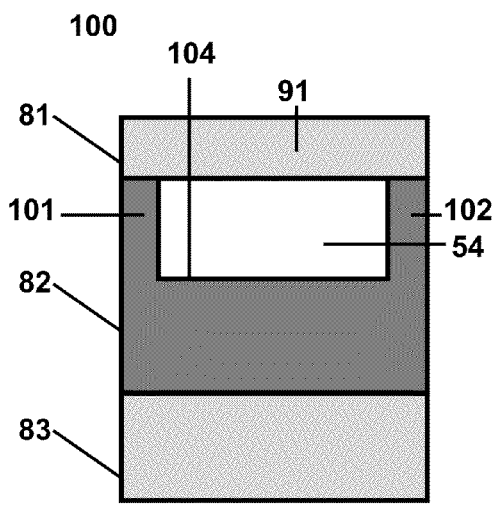
FIG. 10A(A-A)
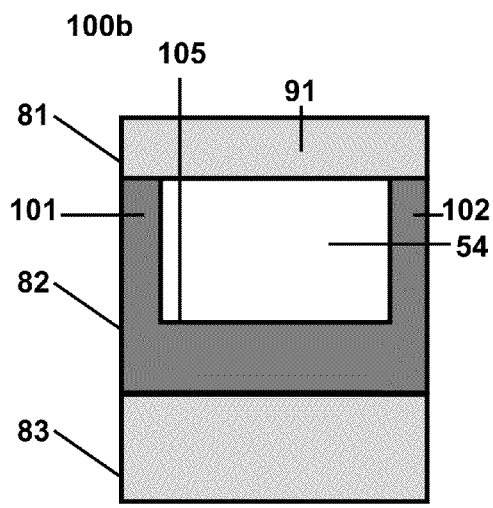
FIG. 10B(A-A)

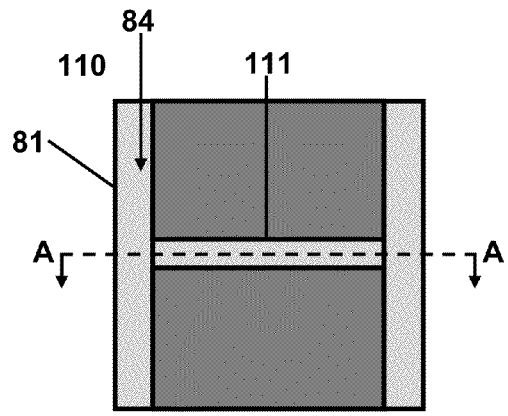
FIG. 11A
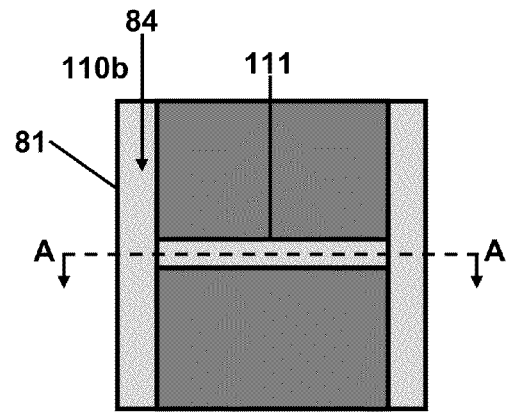
FIG. 11B
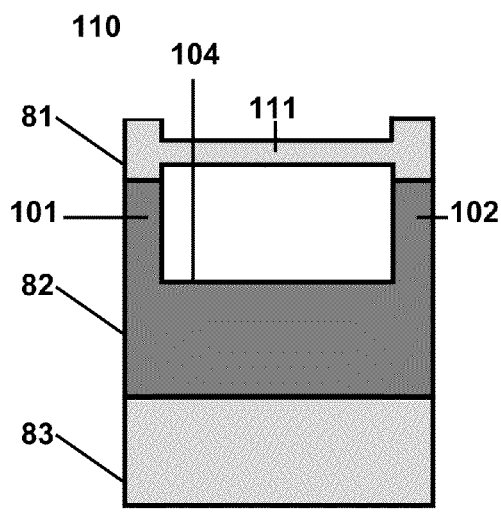
FIG. 11A(A-A)
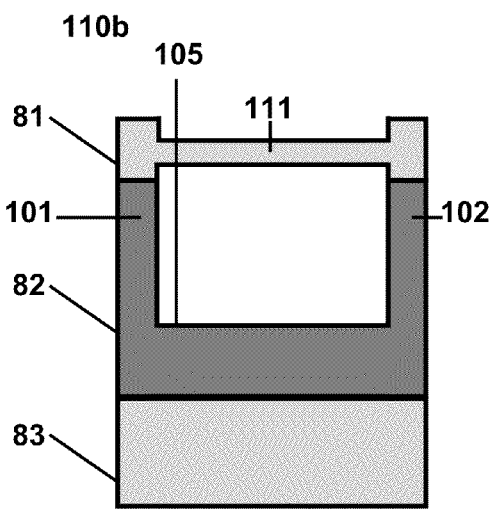
FIG. 11B(A-A)

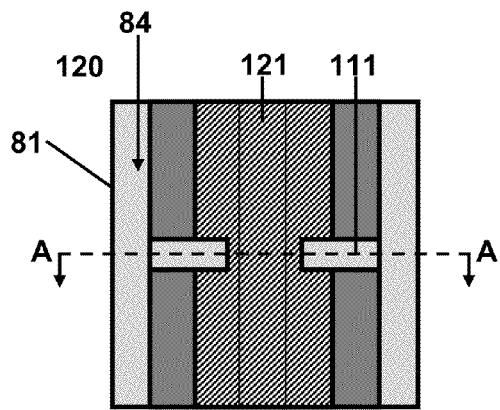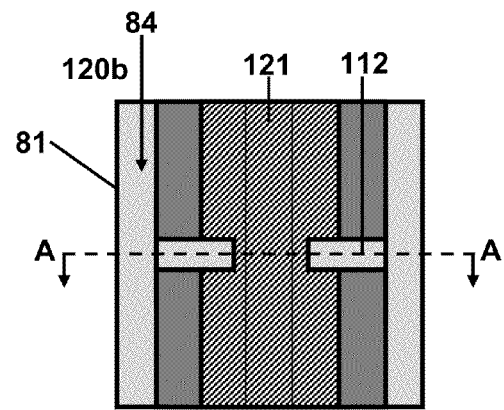
FIG. 12A　　　　　　　　　　　FIG. 12B
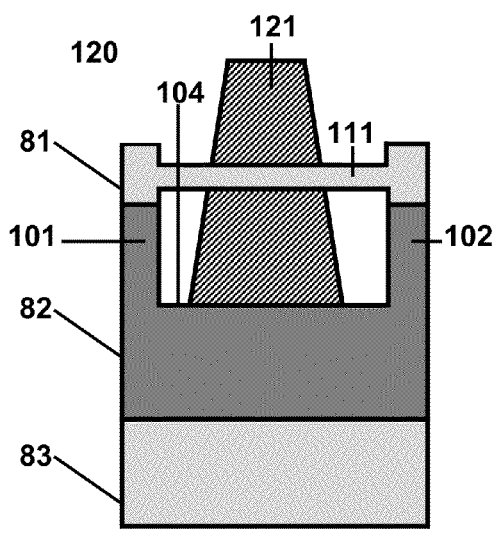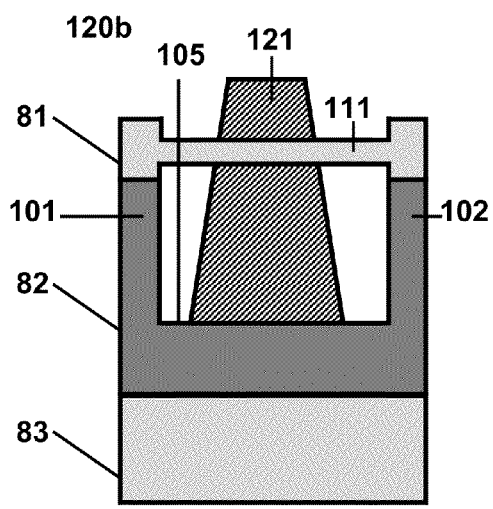
FIG. 12A(A-A)　　　　　　　　FIG. 12B(A-A)

TUNING GATE LENGTHS IN SEMICONDUCTOR DEVICE STRUCTURES

BACKGROUND

1. Field of the Invention

The present invention relates generally to nanowire complementary metal-oxide-semiconductor (CMOS) field effect transistor (FET) device structures and methods for fabricating these device structures. More specifically, the present invention relates to semiconductor nanowire FET device structures having the suspension height of the nanowire channels altered in order to tune the gate lengths of the resulting nanowire FET device structures.

2. Description of Related Art

This section is intended to provide a context to the invention that is recited in the claims. The description herein may include concepts that can be pursued, but are not necessarily ones that have been previously conceived or pursued. Therefore, unless otherwise indicated herein, what is described in this section is not prior art to the description and claims in this application and is not admitted to be prior art by inclusion in this section.

As microelectronic scaling proceeds beyond the 14 nm technology node, the number of levels requiring sublithographic pitches continues to grow. Even with advanced lithographic techniques, such as extreme UV (EUV) or electron-beam lithography (e-beam), certain critical levels, such as fins (for FinFETs or trigates), gates, and dense wiring levels, are expected to demand feature pitches at or below the limits of resolution of direct lithography. Existing patterning solutions in these cases include pitch multiplication techniques such as interleaved multiple exposures, sidewall image transfer (SIT), and directed self-assembly (DSA).

When direct lithography is pushed to its 2-dimensional resolution limit or when pitch multiplication techniques are used, gratings of uniformly sized lines quickly become the easiest pattern to achieve. Deviations from a uniform grating cause poor printing or degrade the achievable pitch. In particular, the ability to pattern lines of different widths becomes difficult at very tight pitches.

The gate level has historically been one of the densest features of a technology and the gate level is expected to reside at or below the limits of lithography as scaling continues beyond the 14 nm node. The ability to modulate gate length, however, has been a powerful design tool for many CMOS technologies. Shorter gate length devices provide enhanced on-current at the expense of greater leakage, while longer gate length devices are slower in the on-state, but consume less power in the off-state. Therefore, a method to modulate gate length without actually printing differently sized gate lines would be of great use in future technology nodes.

A nanowire transistor device structure is characterized by a semiconductor nanowire passing through a gate structure to connect a source region and a drain region. Doing so forms a nanowire channel electrically connecting the source and drain regions such that the gate controls the current in the channel. A nanowire channel FET can be created such that the gate fully surrounds the nanowire such that the channel forms at the surface of the nanowires within the gate. In larger devices, different gate-lengths can be achieved by directly patterning differently sized lines. However, as devices become smaller and smaller, requiring the fabrication of even tinier transistors, it becomes extremely difficult to engineer the various multiple gate lengths.

Therefore, methods for achieving multiple gate lengths at tight gate pitches, as well as the resulting devices, that do not increase production costs are highly desired.

SUMMARY

A method for modulating a gate length of a nanowire transistor device structure, the method including: providing a stack of materials, wherein the stack of materials includes a substrate layer, an insulator layer disposed on the substrate layer, and a sacrificial layer disposed on the insulator layer; removing a portion of the sacrificial layer to form a recessed surface, wherein a depth that the recessed surface is etched to determines a channel length; forming, on the sacrificial layer, a semiconductor layer having an upper section and a recessed section; removing a portion of the recessed section of the semiconductor layer to form a crossing section and a plurality of depressed regions; removing a portion of the sacrificial layer under the recessed section of the semiconductor layer to form an undercut; forming a nanowire from the crossing section of the semiconductor layer; and patterning a tapered gate stack within the undercut such that the tapered gate stack is disposed around a portion of the nanowire.

A method for modulating a gate length of a nanowire transistor device structure, the method including: providing a stack of materials, wherein the stack of materials includes a substrate layer, an insulator layer disposed on the substrate layer, and a sacrificial layer disposed on the insulator layer; removing a first portion of a top surface of the semiconductor layer to form a crossing section and a plurality of depressed regions; removing a second portion of the insulator layer under the top surface of the semiconductor layer to form a step, wherein a depth that the step is etched to determines a channel length; forming a nanowire from the crossing section of the semiconductor layer; and patterning a tapered gate stack on the step such that the tapered gate stack is disposed around a portion of the nanowire.

A method for modulating a plurality of gate lengths of a plurality of nanowire transistor device structures, the method including: providing a plurality of stacks of materials, wherein a stack of materials includes a substrate layer, an insulator layer disposed on the substrate layer, and a sacrificial layer disposed on the insulator layer; removing a portion of the sacrificial layer to form a recessed surface, wherein a depth that the recessed surface is etched to determines a channel length; forming, on the sacrificial layer, a semiconductor layer having an upper section and a recessed section; removing a portion of the recessed section of the semiconductor layer to form a crossing section and a plurality of depressed regions; removing a portion of the sacrificial layer under the recessed section of the semiconductor layer to form an undercut; forming a nanowire from the crossing section of the semiconductor layer; forming a tapered gate stack within the undercut such that the tapered gate stack is disposed around a portion of the nanowire; and using a same patterned gate stack to form a second nanowire of a different channel length.

A method for modulating a plurality of gate lengths of a plurality of nanowire transistor device structures, the method including: providing a plurality of stacks of materials, wherein a stack of materials comprises a substrate layer, an insulator layer disposed on the substrate layer, and a sacrificial layer disposed on the insulator layer; removing a first portion of a top surface of the semiconductor layer to form a crossing section and a plurality of depressed regions; removing a second portion of the insulator layer under the top surface of the semiconductor layer to form a step, wherein a depth that the step is etched to determines a channel length; forming a nanowire from the crossing section of the semiconductor layer; patterning a tapered gate stack on the step such that the tapered gate stack is disposed around a portion of the nanowire; and using a same patterned gate stack to form a second nanowire of a different channel length.

BRIEF DESCRIPTION OF THE SEVERAL VIEWS OF THE DRAWINGS

FIGS. 1 and 1(A-A) illustrate an initial stack of materials. More specifically:

FIG. 1 illustrates a top view of the initial stack of materials; and

FIG. 1(A-A) illustrates a cross section view of the initial stack of materials.

FIGS. 2A-2B(A-A) illustrate intermediate structures of FIG. 1 and FIG. 1(A-A) following the removal of a portion of the sacrificial layer. More specifically:

FIG. 2A illustrates a top view of the initial stack of materials of FIG. 1, in which no portion of the sacrificial layer has been removed;

FIG. 2B illustrates a top view of the initial stack of materials of FIG. 1 after a portion of the sacrificial layer has been removed;

FIG. 2A(A-A) illustrates a cross section view of FIG. 2A; and

FIG. 2B(A-A) illustrates a cross section view of FIG. 2B.

FIGS. 3A-3B(A-A) illustrate intermediate structures of FIG. 2A and FIG. 2B after a semiconductor layer has been formed on the sacrificial layer. More specifically:

FIG. 3A illustrates a top view of the intermediate structure of FIG. 2A after a semiconductor layer has been formed on the sacrificial layer;

FIG. 3B illustrates a top view of the intermediate structure of FIG. 2B after a semiconductor layer has been formed on the recessed sacrificial layer;

FIG. 3A(A-A) illustrates a cross section view of FIG. 3A; and

FIG. 3B(A-A) illustrates a cross section view of FIG. 3B.

FIGS. 4A-4B(A-A) illustrate intermediate structures of FIG. 3A and FIG. 3B following removal of portions of the semiconductor layer to form crossing sections. More specifically:

FIG. 4A illustrates a top view of the intermediate structure of FIG. 3A following removal of portions of the semiconductor layer to form a crossing section;

FIG. 4B illustrates a top view of the intermediate structure of FIG. 3B following removal of portions of the semiconductor layer to form a crossing section;

FIG. 4A(A-A) illustrates a cross section view of FIG. 4A; and

FIG. 4B(A-A) illustrates a cross section view of FIG. 4B.

FIGS. 5A-5B(A-A) illustrate intermediate structures of FIG. 4A and FIG. 4B following removal of portions of the sacrificial layer to form voids beneath the crossing sections. More specifically:

FIG. 5A illustrates a top view of the intermediate structure of FIG. 4A following removal of portions of the sacrificial layer to form a void beneath the crossing section;

FIG. 5B illustrates a top view of the intermediate structure of FIG. 4B following removal of portions of the sacrificial layer to form a void beneath the crossing section;

FIG. 5A(A-A) illustrates a cross section view of FIG. 5A; and

FIG. 5B(A-A) illustrates a cross section view of FIG. 5B.

FIGS. 6A-6B(A-A) illustrate intermediate structures of FIG. 5A and FIG. 5B following formation of nanowires from the crossing sections. More specifically:

FIG. 6A illustrates a top view of the intermediate structure of FIG. 5A following formation of a nanowire from the crossing section;

FIG. 6B illustrates a top view of the intermediate structure of FIG. 5B following formation of a nanowire from the crossing section;

FIG. 6A(A-A) illustrates a cross section view of FIG. 6A; and

FIG. 6B(A-A) illustrates a cross section view of FIG. 6B.

FIGS. 7A-7B(A-A) illustrate embodiments of the present invention, which have had a gate structure formed in each of the voids of the intermediate structures of FIG. 6A and FIG. 6B such that each gate structure surrounds a portion of the nanowire. More specifically:

FIG. 7A illustrates a top view of an embodiment of the present invention, which has had a gate structure formed in the void of the intermediate structure of FIG. 6A such that each gate structure surrounds a portion of the nanowire;

FIG. 7B illustrates a top view of an embodiment of the present invention, which has had a gate structure formed in the void of the intermediate structure of FIG. 6B such that each gate structure surrounds a portion of the nanowire;

FIG. 7A(A-A) illustrates a cross section view of FIG. 7A; and

FIG. 7B(A-A) illustrates a cross section view of FIG. 7B.

FIGS. 8A-8B(A-A) illustrate an initial stack of materials. More specifically:

FIG. 8A illustrates a top view of the initial stack of materials;

FIG. 8B illustrates a top view of the initial stack of materials;

FIG. 8A(A-A) illustrates a cross section view of FIG. 8A; and

FIG. 8B(A-A) illustrates a cross section view of FIG. 8B.

FIGS. 9A-9B(A-A) illustrate intermediate structures of FIG. 8A and FIG. 8B following removal of portions of the semiconductor layer to form crossing sections. More specifically:

FIG. 9A illustrates a top view of the initial stack of materials of FIG. 8A following removal of a portion of the semiconductor layer to form a crossing section;

FIG. 9B illustrates a top view of the initial stack of materials of FIG. 8B following removal of a portion of the semiconductor layer to form a crossing section;

FIG. 9A(A-A) illustrates a cross section view of FIG. 9A; and

FIG. 9B(A-A) illustrates a cross section view of FIG. 9B.

FIGS. 10A-10B(A-A) illustrate intermediate structures of FIG. 9A and FIG. 9B following removal of portions of the insulator layer to form steps beneath the crossing sections. More specifically:

FIG. 10A illustrates a top view of the intermediate structure of FIG. 9A following removal of a portion of the insulator layer to form a step beneath the crossing section;

FIG. 10B illustrates a top view of the intermediate structure of FIG. 9B following removal of a portion of the insulator layer to form a deeper step beneath the crossing section;

FIG. 10A(A-A) illustrates a cross section view of FIG. 10A; and

FIG. 10B(A-A) illustrates a cross section view of FIG. 10B.

FIGS. 11A-11B(A-A) illustrate intermediate structures of FIG. 10A and FIG. 10B following the formation of nanowires from the crossing sections. More specifically:

FIG. 11A illustrates a top view of the intermediate structure of FIG. 10A following formation of a nanowire from the crossing section;

FIG. 11B illustrates a top view of the intermediate structure of FIG. 10B following formation of a nanowire from the crossing section;

FIG. 11A(A-A) illustrates a cross section view of FIG. 11A; and

FIG. 11B(A-A) illustrates a cross section view of FIG. 11B.

FIGS. 12A-12B(A-A) illustrate embodiments of the present invention, which have had a gate structure formed on each step of the intermediate structures of FIG. 11A and FIG. 11B such that each gate structure surrounds a portion of the nanowire. More specifically:

FIG. 12A illustrates a top view of an embodiment of the present invention, which has had a gate structure formed on the step of the intermediate structure of FIG. 11A such that the gate structure surrounds a portion of the nanowire;

FIG. 12B illustrates a top view of an embodiment of the present invention, which has had a gate structure formed on the deeper step of the intermediate structure of FIG. 11B such that the gate structure surrounds a portion of the nanowire;

FIG. 12A(A-A) illustrates a cross section view of FIG. 12A; and

FIG. 12B(A-A) illustrates a cross section view of FIG. 12B.

DETAILED DESCRIPTION

The present invention provides a semiconductor nanowire FET device structure having the suspension height of the nanowire altered in order to tune the gate length and a method of fabricating such a device structure. The present invention is described in greater detail by referring to the following discussion and the drawings that accompany the present disclosure.

It will be readily understood that components of the present invention, as generally described and illustrated in the Figures herein, can be arranged and designed in a wide variety of different configurations in addition to the presently described preferred embodiments. Thus, the following detailed description of some embodiments of the present invention, as represented in the Figures, is not intended to limit the scope of the present invention as claimed, but is merely representative of selected presently preferred embodiments of the present invention.

The present invention is to be understood within the context of the description provided below. The description provided below is to be understood within the context of the Figures provided and described above. The Figures are intended for illustrative purposes and, as such, are not necessarily drawn to scale.

While the instant described embodiments illustrate the invention within the context of a bulk semiconductor substrate, these embodiments are not intended to be so limited. Rather, under certain circumstances, the embodiments of the present invention can also be practiced within the context of semiconductor-on-insulator (SOI) substrates and hybrid orientation substrates.

Typically, fabricating nanowire transistor device structures with various gate lengths requires patterning different sizes and dimensions of gate stacks during the fabrication process. This means that, in order to form nanowires of different channel lengths, the number of patterning steps during the overall fabrication process increases, which causes an increase in overall production costs. In other words, as the number of different channel lengths required increases, so does the cost of fabricating the various channel length nanowire transistor device structures. Since the length of the portion of the nanowire that is within the gate (channel length) dictates the critical features of the device performance, such as the on-state current, off-state leakage, and gate capacitance, having the ability to produce nanowire transistor device structures with various gate lengths without greatly increasing the cost of production is highly desired.

Embodiments of the present invention teach fabrication methods for fabricating nanowire transistor device structures having various gate lengths without having to alter the dimensions of the gate regions and without having to significantly, if at all, increase the number of patterning steps during the overall fabrication process. Doing so permits the gate length to be tuned to accommodate the range of low-power to high performance device characteristics needed for efficient circuit design.

The present invention allows for the tuning of nanowire gate length in multiple ways. The first method is by offsetting the height of the nanowires while utilizing gates of similar tapered dimensions, such that the nanowires pass through the gate regions at different heights and result in different gate length nanowire transistor device structures. The second method is by offsetting the height of the steps that the gates of similar tapered dimensions are formed on, such that the nanowires pass through the gate regions at different heights, resulting in different gate length nanowire transistor device structures.

FIGS. 1-7B(A-A) illustrate the tuning of nanowire gate lengths according to the first method. FIGS. 7A, 7B, 7(A-A), and 7B(A-A) illustrate two embodiments of the nanowire transistor device structures formed by having the gate lengths tuned according to the first method. In these embodiments, tuning of the nanowire gate length is accomplished by offsetting the height of the nanowires while utilizing gates of similar tapered dimensions, such that the nanowires pass through the gate regions at different heights and result in different gate lengths (channel lengths). This method provides different effective gate lengths while using the same lithography or patterning steps.

Note that, although the two embodiments of the nanowire transistor device structures formed according to the first method are discussed together, this is not to imply that both embodiments must be fabricated simultaneously. The purpose is to highlight how the first method can be used to provide nanowire transistor device structures with various gate lengths. In other words, these examples highlight how various gate lengths can be fabricated without having to increase the number of patterning steps.

Reference is first made to FIGS. 1 and 1(A-A), which illustrate an initial stack of materials 10 of the present invention. FIG. 1 is a top view of the initial stack of materials 10 and FIG. 1(A-A) is a cross section view taken along line A-A of FIG. 1.

Referring to FIG. 1, a top down view of an initial stack of materials 10 is illustrated, including a semiconductor structure 10 having a sacrificial layer 11 as the top layer. The sacrificial layer 11 also includes a top surface 14. Cross section A-A (represented by the horizontal dashed line) is shown in FIG. 1(A-A) and is hereafter utilized to describe the initial stack of materials 10 of the present invention.

Referring to FIG. 1(A-A), a cross section view of the initial stack of materials 10 of FIG. 1 is shown, taken through cross section A-A. The sacrificial layer 11 is disposed on an insulator layer 12. The insulator layer 12 is disposed on a substrate layer 13.

In a preferred embodiment of the present invention, the sacrificial layer 11 is of Silicon Germanium (SiGe), the insulator layer 12 is of Silicon Dioxide ($SiO_2$), and the substrate layer 13 is of Silicon (Si). Preferably the SiGe sacrificial layer 11 has a thickness of 5 nm to 50 nm, the $SiO_2$ insulator layer 12 has a thickness of 5 nm to 1 um, or more typically 100 nm to 200 nm, and the Si substrate layer 13 has a thickness adequate to provide structural stability, typically >100 um.

Reference is made hereafter to FIGS. 2A, 2B, 2A(A-A), and 2B(A-A), which illustrate an intermediate step of an embodiment of the present invention. In particular, the step of removing a portion of the sacrificial layer 11 to form a recessed surface 21 such that the distance between the top surface 14 of the sacrificial layer 11 and the insulator layer 12 in FIGS. 2A and 2A(A-A) is greater than the distance between the recessed surface 21 of the sacrificial layer 11 and the insulator layer 12 in FIGS. 2B and 2B (A-A).

Referring to FIGS. 2A and 2B, top down views of intermediate semiconductor structures 20 and 20b are illustrated. FIG. 2A illustrates a top view of the initial stack of materials of FIG. 1, in which no portion of the sacrificial layer has been removed. FIG. 2B illustrates a top view of the intermediate semiconductor structure 20b, having had a portion of the sacrificial layer 11 removed from the initial stack of materials 10 to form a recessed surface 21. Cross section views A-A are shown in FIGS. 2A(A-A) and 2B(A-A) and are hereafter utilized to describe these two embodiments of the present invention.

Referring to FIG. 2A(A-A), a cross section view of the intermediate semiconductor structure 20 is illustrated, in which no portion of the sacrificial layer has been removed. Referring to FIG. 2B(A-A), a cross section view of the intermediate structure 20b is illustrated, in which a portion of the sacrificial layer has been removed resulting in the recessed surface 21. As illustrated, the recessed surface 21 is formed such that the distance separating the top surface 14 from the insulator layer 12 in FIG. 2A(A-A) is greater than the distance separating the recessed surface 21 from the insulator layer 12 in FIG. 2B(A-A).

In a preferred embodiment of the present invention, the recessed surface 21 is formed by removing a portion of the SiGe sacrificial layer 11 by photolithography and reactive ion etching (RIE). Preferably, the SiGe sacrificial layer 11 is recessed by 5 nm to 20 nm to create the recessed surface 21 on the SiGe sacrificial layer 11.

Note that the fabrication step described in FIGS. 2A-2B (A-A) is the key step for providing the tuning of various gate lengths without having to significantly increase fabrication costs. As is made more apparent later, this is the only patterning step that needs to be altered in order to provide the various gate lengths for the nanowire transistor device structures formed. The rest of the patterning steps to fabricate the different channel lengths can be substantially the same. The depth that the recessed surface is etched to is what can ultimately determine the resulting channel length.

Reference is made hereafter to FIGS. 3A, 3B, 3A(A-A), and 3B(A-A), which illustrate an intermediate step of the two embodiments of the present invention. In particular, the step of forming a semiconductor layer 31 on the sacrificial layer 11.

Referring to FIGS. 3A and 3B, top down views of intermediate semiconductor structures 30 and 30b are illustrated. The intermediate semiconductor structures 30 and 30b shown are an intermediate structure of the present invention having had a semiconductor layer 31 formed on the sacrificial layer 11, such that the semiconductor layer 31 has an upper section 32 in FIG. 3A(A-A) and a recessed section 33 in FIG. 3B(A-A). Cross section views A-A are shown in FIGS. 3A(A-A) and 3B(A-A) and are hereafter utilized to describe these embodiments of the present invention.

Referring to FIGS. 3A(A-A) and 3B(A-A), cross section views of the intermediate semiconductor structures 30 and 30b are illustrated. FIG. 3A(A-A) illustrates a cross section view of the intermediate structure of FIG. 2A after the semiconductor layer 31 has been formed on the sacrificial layer 11. As illustrated, the upper section 32 of the semiconductor layer 31 is disposed on the top surface 14 of the sacrificial layer 11. FIG. 3B(A-A) illustrates a cross section view of the intermediate structure of FIG. 2B after the semiconductor layer 31 has been formed on the recessed surface 21. As illustrated, the recessed section 33 of the semiconductor layer 31 is disposed on the recessed surface 21 of the sacrificial layer 11.

In a preferred embodiment of the present invention, the intermediate structures 20 and 20b of FIG. 2A and FIG. 2B, respectively, have had a semiconductor layer 31 of Silicon (Si) disposed on the sacrificial layer 11 of SiGe. Because of the underlying configuration of the SiGe sacrificial layer 11 of FIGS. 2A and 2B, which includes top surface 14 and recessed surface 21, the semiconductor layer 31 of Si reflects the geometry of the underlying sacrificial layer 11 of SiGe. Therefore, the semiconductor layer 31 has an upper section 32 in FIG. 3A(A-A) and the semiconductor layer 31 has a recessed section 33 in FIG. 3B(A-A). The Si semiconductor layer 31 is disposed on the SiGe sacrificial layer 11 via epitaxial growth to a thickness of 1 nm to 100 nm, or more preferably 5 nm to 20 nm.

Reference is made hereafter to FIGS. 4A, 4B, 4A(A-A), and 4B(A-A), which illustrate an intermediate step of the two embodiments of the present invention. In particular, the step of removing a portion of the upper section 32 and recessed section 33 of the semiconductor layer 31 to form crossing sections 41 and depressed regions DR.

Referring to FIGS. 4A and 4B, top down views of intermediate semiconductor structures 40 and 40b are illustrated. The intermediate semiconductor structures 40 and 40b shown are intermediate structures of the present invention having had portions of the upper section 32 and the recessed section 33 of the semiconductor layer 31 removed, thereby forming crossing sections 41. In FIG. 4A a portion of upper section 32 of the semiconductor layer 31 is removed to form crossing section 41 and depressed regions DR. In FIG. 4B a portion of the recessed section 33 of the semiconductor layer 31 is removed to form crossing section 42 and depressed regions DR. Cross sections A-A are shown in FIGS. 4A(A-A) and 4B(A-A) and are hereafter utilized to describe these embodiment of the present invention.

Referring to FIGS. 4A(A-A) and 4B(A-A), cross section views of intermediate semiconductor structures 40 and 40b are illustrated. FIG. 4A(A-A) illustrates a cross section view of the intermediate structure of FIG. 3A following removal of portions of the semiconductor layer 31 to form crossing section 41. As illustrated, the upper section 32 of the semiconductor layer 31 has had portions removed to form crossing section 41. FIG. 4B(A-A) illustrates a cross section view of the intermediate structure of FIG. 3B following removal of portions of the semiconductor layer 31 to form crossing section 41. As illustrated, the recessed section 33 of the semiconductor layer 31 has had portions removed to form crossing section 41.

In a preferred embodiment of the present invention, the intermediate structures 30 and 30b of FIG. 3A and FIG. 3B, respectively, have had multiple portions of the semiconductor layer of Silicon (Si) removed to form the crossing sections 41 via lithography and RIE. The crossing sections 41 preferably having a width ranging from 1 nm to 20 nm. By removing multiple portions of the Si semiconductor layer 31 via lithography and RIE, the SiGe sacrificial layer 11 is exposed on the sides of the crossing sections 41.

Reference is made hereafter to FIGS. 5A, 5B, 5A(A-A), and 5B(A-A), which illustrate an intermediate step of the two embodiments of the present invention. In particular, the step of removing a portion of the sacrificial layer 11 under both the upper section 32 and the recessed section 33 of the semiconductor layer 31 to form first spacers 51, second spacers 52, and voids 54 therebetween.

Referring to FIGS. 5A and 5B, top down views of intermediate semiconductor structures 50 and 50b are illustrated. The intermediate semiconductor structures 50 and 50b shown are intermediate structures of the present invention having had portions of the sacrificial layer 11 removed, thereby forming first spacers 51, second spacers 52, and voids 54. Cross section views A-A are shown in FIGS. 5A(A-A) and 5B(A-A) and are hereafter utilized to describe these two embodiments.

Referring to FIGS. 5A(A-A) and 5B(A-A), cross section views of the intermediate semiconductor structures 50 and 50b are illustrated. FIG. 5A(A-A) illustrates a cross section view of the intermediate structure of FIG. 4A following removal of portions of the sacrificial layer 11 to form a void 54 beneath the crossing section 41. As illustrated, the sacrificial layer 11 has had portions of the sacrificial layer 11 removed to form a void 54 beneath the crossing section 41 of the upper section 32 of the semiconductor layer 31. FIG. 5B(A-A) illustrates a cross section view of the intermediate structure of FIG. 4B following removal of portions of the sacrificial layer 11 to form a void 54 beneath the crossing section 41. As illustrated, the sacrificial layer 11 has had portions of the sacrificial layer 11 removed to form a void 54 beneath the crossing section 41 of the recessed section 33 of the semiconductor layer 31.

Note that the features first spacers 51, second spacers 52, and voids 54 are referred to in this way for ease of understanding and for illustrative purposes. In reality, the sacrificial layer 11 is recessed below the semiconductor layer 31 and then undercut. In larger structures this results in the edge of the sacrificial layer 11 being offset slightly from the edge of the semiconductor layer 31, forming a small opening (air gap) to form the patterned gate stack in (explained later). However, in very small structures the sacrificial layer 11 is completely removed from underneath the semiconductor layer 31 forming a complete void, such as void 54, to form the patterned gate stack in.

In a preferred embodiment of the present invention, the intermediate structures 40 and 40b of FIG. 4A and FIG. 4B have had multiple portions of the SiGe sacrificial layer 11 removed via isotropic wet or dry etching to a form first spacers 51, second spacers 52, and voids 54. By removing multiple portions of the SiGe sacrificial layer 11 via isotropic wet or dry etching, the $SiO_2$ insulator layer 12 is exposed beneath the crossing sections 41.

Reference is made hereafter to FIGS. 6A, 6B, 6A(A-A), and 6B(A-A), which illustrate an intermediate step of the two embodiments of the present invention. In particular, the step of forming nanowires 61 from the crossing sections 41 of the semiconductor layer 31.

Referring to FIGS. 6A and 6B, top down views of intermediate semiconductor structures 60 and 60b are illustrated. The intermediate semiconductor structures 60 and 60b shown are intermediate structures of the present invention having had the crossing sections 41 narrowed to form nanowires 61. Cross section views A-A are shown in FIGS. 6A(A-A) and 6B(A-A) and are hereafter utilized to describe these embodiments of the present invention.

Referring to FIGS. 6A(A-A) and 6B(A-A), cross section views of the intermediate semiconductor structures 50 and 50b are illustrated. FIG. 6A(A-A) illustrates a cross section view of the intermediate structure of FIG. 5A following formation of the nanowire 61 from the crossing section 41. As illustrated, the crossing section 41 has been narrowed to form a nanowire 61. FIG. 6B(A-A) illustrates a cross section view of the intermediate structure of FIG. 5B following formation of the nanowire 61 from the crossing section 41. As illustrated, the crossing section 41 has been narrowed to form a nanowire 61.

In a preferred embodiment of the present invention, the crossing sections 41 are narrowed via hydrogen anneal to form the nanowires 61 of Silicon. The nanowires 61 are preferably 2 nm-100 nm in diameter.

Reference is made hereafter to FIGS. 7A, 7B, 7A(A-A), and 7B(A-A), which illustrate a final step, according to the first method, for forming the two embodiments of the present invention. In particular, the step of forming tapered gate stacks 71 within the voids 54 such that a tapered gate stack 71 is disposed around a portion of the nanowire 61. The tapered gate stacks 71 are formed to have substantially the same dimensions (using the same lithographic patterning), such that the length of the portion of the nanowire 61 in FIG. 7A(A-A) extending through the tapered gate stack 71 is shorter than the length of the portion of the nanowire 61 in FIG. 7B(A-A) extending through the tapered gate stack 71. Note that this means that the same gate stack can be patterned during this lithographic patterning step and different channel lengths (a short channel in semiconductor structure 70 and a long channel in semiconductor structure 70b) can result. This means that the lithographic patterning process can result in different channel lengths without having to increase the number of steps performed in the overall fabrication process.

Referring to FIGS. 7A and 7B, top down views of two embodiments of the present invention, semiconductor structures 70 and 70b, are illustrated. Cross section views A-A are shown in FIGS. 7A(A-A) and 7B(A-A) and are hereafter utilized to further describe these two embodiments of the present invention.

The semiconductor structure 70, as shown in FIG. 7A(A-A), includes: an insulator layer 12 disposed on a substrate layer 13; a plurality of spacers 51, 52 disposed on the insulator layer 12, including first spacer 51 separated from second spacer 52; a semiconductor layer 31 including an upper section 32, which is disposed on first spacer 51 and second spacer 52; a nanowire 61 within the upper section 32 of the semiconductor layer 31; a tapered gate stack 71 between the first spacers 51 and the second spacers 52, such that the tapered gate stack 71 is disposed around a portion of the nanowire 61.

The semiconductor structure 70b, as shown in FIG. 7B(A-A), includes: an insulator layer 12 disposed on a substrate layer 13; a plurality of spacers 51, 52 disposed on the insulator layer 12, including first spacers 51 separated from second spacers 52; a semiconductor layer 31 including a recessed section 33, which is disposed on first spacer 51 and second spacer 52, and the distance between an upper section and the insulator layer 12 is greater than the distance between the recessed section 33 and the insulator layer 12; a nanowire 61 within the recessed section 33 of the semiconductor layer 31; a tapered gate stack 71 between the first spacers 51 and the second spacers 52, such that the tapered gate stack 71 is disposed around a portion of the nanowire 61.

Note that the tapered gate stacks 71 in FIGS. 7A(A-A) and 7B(A-A) have substantially the same dimensions because they are fabricated using the same patterning. As a result the tapered gate stacks being formed by the exact same patterning steps, the length of the portion of the nanowire 61 extending through the tapered gate stack 71 in FIG. 7A(A-A) is shorter than the portion of the nanowire 61 extending through the tapered gate stack 71 in FIG. 7B(A-A). Therefore, nanowire 61 represents a short channel length in the nanowire transistor device structure 70 and nanowire 61 represents a long channel in a nanowire transistor device structure 70b.

Referring to FIGS. 7A(A-A) and 7B(A-A), cross section views of semiconductor structures 70 and 70b are illustrated. FIGS. 7A(A-A) and 7B(A-A) illustrate cross section views of two embodiments of the present invention, which have had a gate structure (tapered gate stacks 71) formed within the voids 54 of the structures, such that each gate structure (gate stack 71) surrounds a portion of the nanowires 61. As illustrated, tapered gate stacks 71 have been disposed on the insulator layer 12 and both are of substantially the same dimensions. Due to the difference in suspension height between the nanowire 61 in FIG. 7A(A-A) and the nanowire 61 in FIG. 7B(A-A), and due to the substantially the same patterned tapered gate stacks 71, the lengths of the portions of the nanowires 61 each gate stack 71 respectively surrounds are not equal. Therefore, nanowire 61 in FIG. 7A(A-A) represents a short channel and nanowire 61 in FIG. 7B(A-A) represents a long channel.

In a preferred embodiment of the present invention, the intermediate structures 60 and 60b have had the gate stacks 71 formed preferably via atomic layer deposition (ALD), chemical vapor deposition (CVD), or physical vapor deposition (PVD). The resulting tapered gate stacks 71 can include a gate dielectric such as HfO2, a gate metal such as TiN or TaN, and/or other capping materials such as polysilicon or SiN. The gate stacks 71 have, preferably, dimensions of between 5 nm and 100 nm, and more preferably between 10 nm to 30 nm. Because the tapered gate stacks 71 are formed at substantially the same level on the SiO2 insulator layer, the gate lengths of the resulting nanowire FETs are dictated by the depth of the etch that sets the height of the recessed surface 21.

Accordingly, the present invention teaches the tuning of nanowire FET gate length through the adjustment of the suspension height. In other words, the present invention teaches tuning of various gate lengths using a lithographic patterning process that does not require an increase in the number of steps performed in the overall process in order to provide various gate lengths. A technology can include many nanowires, with each having a gate length determined by two things: (1) its modulated suspension height; and (2) a single fixed global patterned gate dimension (gate stack). For example, a technology can have a fixed number of discreet suspension heights (e.g. 2, 3, or 4). This fixed number of suspension heights would allow the fabrication of various multiple gate lengths with the use of one fixed global patterned gate dimension.

By changing only one patterning step during the fabrication process (the step described in reference to FIGS. 2A-2B(A-A) different gate lengths of a nanowire transistor device structure can result. In other words, the gate length of the nanowire transistor device structure can be arbitrarily modulated by the nanowire suspension height, in which all of the same patterning steps, except for one, can be used to provide various gate lengths of the nanowire transistor device structures.

FIGS. 8A-12B(A-A) illustrate the tuning of the nanowire gate length according to the second method. FIGS. 12A, 12B, 12A(A-A), and 12B(A-A) illustrate two embodiments of the nanowire transistor device structures formed by having the gate lengths tuned according to the second method. In these two embodiments, tuning of the nanowire gate length is accomplished by offsetting the height of the steps that the gates are formed on, such that the nanowires pass through the gate regions at different heights, resulting in different gate lengths.

Note again that, although the two embodiments of the nanowire transistor device structures formed according to the second method are discussed together, this is not to imply that both embodiments must be fabricated simultaneously. The purpose is to highlight how the second method can be used to provide nanowire transistor device structures with various gate lengths.

Reference is first made to FIGS. 8A, 8B, 8A(A-A), and 8B(A-A), which illustrate initial stacks of materials 80 and 80b of the present invention. FIGS. 8A and 8B are top views of the initial stacks of materials 80 and 80b, respectively. FIGS. 8A(A-A) and 8B(A-A) are cross section views of FIGS. 8A and 8B, respectively, taken along line A-A.

Referring to FIGS. 8A and 8B, top down views of initial stacks of materials 80 and 80b (or semiconductor structures 80 and 80b) are illustrated, respectively. The initial stacks of materials 80 and 80b include a semiconductor layer 81 as the top layer. The semiconductor layer 81 has a top surface 84. Cross section views A-A are shown in FIGS. 8A(A-A) and 8B(A-A) and are hereafter utilized to describe the initials stacks of materials 80 and 80b.

Referring to FIGS. 8A(A-A) and 8B(A-A), cross section views of the initial stacks of materials 80 and 80b of FIGS. 8A and 8B, respectively, are shown taken through cross section A-A. The semiconductor layer 81 is disposed on an insulator layer 82. The insulator layer is disposed on a substrate layer 83.

In a preferred embodiment of the present invention, the semiconductor layer 81 is of Silicon (Si), the insulator layer 82 is of Silicon Dioxide ($SiO_2$) or a high density plasma oxide, and the substrate layer 83 is of Silicon (Si). Preferably the Si semiconductor layer 81 has a thickness of 5 nm to 100 nm, the $SiO_2$ insulator layer 82 has a thickness of 1 nm to 100 nm, and the Si substrate layer 83 has a thickness of 50 um to 1000 um.

Reference is made hereafter to FIGS. 9A, 9B, 9A(A-A), and 9B(A-A), which illustrate an intermediate step of the two embodiments of the present invention. In particular, the step of removing a portion of the top surface 84 of the semiconductor layer 81 to form a crossing section 91 and depressed regions DR.

Referring to FIGS. 9A and 9B, top down views of intermediate semiconductor structures 90 and 90b are illustrated. The intermediate semiconductor structures 90 and 90b are intermediate structures of the present invention having had portions of the top surface 84 of the semiconductor layer 81 removed, thereby forming a crossing section 91 within the top surface 84 of the semiconductor layer 81. Cross section views A-A are shown in FIGS. 9A(A-A) and 9B(A-a) and are hereafter utilized to describe these two embodiments of the present invention.

Referring to FIGS. 9A(A-A) and 9B(A-A), cross section views of the intermediate semiconductor structures 90 and 90b are illustrated. As illustrated, the top surface 84 of the semiconductor layer 81 has had portions removed to form crossing section 91.

In a preferred embodiment of the present invention, the initial stacks of materials 80 and 80b of FIGS. 8A and 8B, respectively, have had multiple portions of the semiconductor layer 81 of Silicon (Si) removed via reactive ion etch (RIE) to form the crossing sections 91. The crossing sections 91 preferably have a width of 3 nm to 100 nm. By removing multiple portions of the Si semiconductor layer 81 via RIE, the Silicon Dioxide ($SiO_2$) insulator layer 82 is exposed on the sides of the crossing sections 91.

Reference is made hereafter to FIGS. 10A, 10B, 10A(A-A), and 10B(A-A), which illustrate an intermediate step of the two embodiments of the present invention. In particular, the step of removing a portion of the insulator layer 82 under the top surface 84 of the semiconductor layer 81 to form a first spacer 101, a second spacer 102, and a step 104, 105, including voids 54, therebetween.

Referring to FIGS. 10A and 10B, top down views of intermediate semiconductor structures 100 and 100b are illustrated. The intermediate semiconductor structures 100 and 100b are an intermediate structure of the present invention having had portions of the insulator layer 81 removed, thereby forming first spacers 101, second spacers 102, and steps 104, 105. Cross section views A-A are shown in FIGS. 10A(A-A) and 10B(A-A) and are hereafter utilized to describe these two embodiments.

Referring to FIGS. 10A(A-A) and 10B(A-A), cross section views of the intermediate semiconductor structures 100 and 100b are illustrated. As illustrated, the insulator layer 82 has had portions removed to form a step 104, 105, including void 54, beneath the crossing section 91 of the top surface 84 of the semiconductor layer 81. The step 105 in FIG. 10B(A-A) is formed to a depth that is greater than the depth of the step 104 in FIG. 10A(A-A).

Note that the fabrication step described in FIGS. 10A-10B(A-A) is the key step for providing the tuning of various gate lengths without having to significantly increase fabrication costs. As is made more apparent later, this is the only patterning step that needs to be altered in order to provide the various gate lengths for the nanowire transistor device structures formed. The rest of the patterning steps to provide the different channel lengths can be substantially the same. The depth that the step 104, 105 is etched to is what can ultimately determine the resulting channel length.

Note that the features first spacer 101, second spacer 102, and void 54 are referred to in this way for ease of understanding and for illustrative purposes. In reality, the insulator layer 82 is recessed some amount, preferably between 2 nm and 200 nm, below the semiconductor layer 81 and then undercut. In larger structures this results in the edge of the insulator layer 82 being slightly offset from the edge of the semiconductor layer 81, forming a small opening (air gap) to form the patterned gate stack in. However, in very small structures the insulator layer 82 is completely removed from underneath the semiconductor layer 81 forming a complete void, such as void 54, to form the patterned gate stack in.

In a preferred embodiment of the present invention, the intermediate structures 90 and 90b have had portions of the $SiO_2$ insulator layer 82 removed via an anisotropic RIE followed by an isotropic RIE or wet etch to undercut the nanowires, leaving $SiO_2$ only under larger pad areas 101, 102, and air gaps or voids 54.

Reference is made hereafter to FIGS. 11A, 11B, 11A(A-A), and 11B(A-A), which illustrate an intermediate step of the two embodiments of the present invention. In particular, the step of forming nanowires 111 from the crossing sections 91 of the semiconductor layer 81.

Referring to FIGS. 11A and 11B, top down views of intermediate semiconductor structures 110 and 110b are illustrated. The intermediate semiconductor structures 110 and 110b shown are intermediate structure of the present invention having had the crossing sections 91 narrowed to form the nanowires 111. Cross section views A-A are shown in FIGS. 11A(A-A) and 11B(A-A) and are hereafter utilized to describe these two embodiments.

Referring to FIGS. 11A(A-A) and 11B(A-A), cross section views of the intermediate semiconductor structures 110 and 110b are illustrated. As illustrated, the crossing sections 91 have been narrowed to form a nanowire 111.

In a preferred embodiment of the present invention, the crossing section 91 is narrowed via hydrogen annealing to form the nanowire 111 of Silicon. The nanowire 111 is preferably 3 nm-100 nm wide.

Reference is made hereafter to FIGS. 12A, 12B, 12A(A-A), and 12B(A-A), which illustrate a final step according to the second method, for forming the two embodiments of the present invention. In particular, the step of forming a tapered gate stack 121, such that the tapered gate stack 121 is formed on the step 104, 105 such that the tapered gate stack 121 is disposed around a portion of the nanowire 111. The tapered gate stacks 121 in FIGS. 12A(A-A) and 12B(A-A) are formed to have substantially the same dimensions, such that the length of the portion of the nanowire 111 in FIG. 12A(A-A) extending through the tapered gate stack 121 is longer than the length of the portion of the nanowire 111 in FIG. 12B(A-A) extending through the tapered gate stack 121.

Note that this means that the same gate stacks 121 can be patterned during this lithographic patterning step and various channel lengths (a long channel in FIG. 12A(A-A) and a short channel in FIG. 12B(A-A)) can result. This means that various channel lengths can result without having to significantly, if at all, increase the number of steps performed in the overall semiconductor fabrication process. Here, tuning of the gate length is by offsetting the height of the steps that the gates of similar tapered dimensions are formed on, such that the nanowires pass through the gate regions at different heights, resulting in different gate length nanowire transistor device structures.

Referring to FIGS. 12A and 12B, top down views of intermediate semiconductor structures 120 and 120b are illustrated. Cross section views A-A are shown in FIGS. 12A(A-A) and 12B(A-A) and are hereafter utilized to further describe these embodiments of the present invention.

Referring to FIGS. 12A(A-A) and 12B(A-A), cross section views of the intermediate semiconductor structures 120 and 120b are illustrated. As illustrated, a tapered gate stack 121 has been disposed on a step 104, 105 of the insulator layer 82. Due to the difference in depth between the step 104 and the step 105, and due to the tapered gate stacks 121 being of substantially the same dimensions, the length of the portions of the nanowires 111 that each gate stack 121 surrounds is not equal. Therefore, semiconductor structure 120 in FIG. 12A(1-1) represents a long channel and semiconductor structure 120b in FIG. 12B(A-A) represents a short channel.

The semiconductor structure 120, as shown in FIG. 12A(A-A), includes: a substrate layer 83; a step 104 disposed on the substrate layer 83; first and second spacers 101, 102, disposed on the substrate layer 83; a semiconductor layer 81 including a top surface 84, which is disposed on the first spacer 101 and the second spacer 102; a nanowire 111 within the top surface 84 of the semiconductor layer 81; and a tapered gate stack 121 disposed on the first step 104, such that the tapered gate stack 121 is disposed around a portion of the nanowire 111.

The semiconductor structure 120b, as shown in FIG. 12B(A-A), includes: a substrate layer 83; a step 105 disposed on the substrate layer 83; first and second spacers 101, 102, disposed on the substrate layer 83; a semiconductor layer 81 including a top surface 84, which is disposed on the first spacer 101 and the second spacer 102; a nanowire 111 within the top surface 84 of the semiconductor layer 81; and a tapered gate stack 121 disposed on the first step 105, such that the tapered gate stack 121 is disposed around a portion of the nanowire 111.

Note the depth that the step 105 in FIG. 12B(A-A) has been etched down to is deeper than the depth of the step 104 in FIG. 12A(A-A). Therefore, semiconductor structure 120 has a longer channel than semiconductor structure 120b.

The semiconductor material of semiconductor layers 31 and 81, and substrate layers 83 can be any semiconductor material, either doped or undoped, including but not limited to silicon, silicon germanium, germanium, silicon carbide, a III-V compound semiconductor, a II-VI compound semiconductor, a carbon-based semiconductor such as a carbon nanotube or graphene, an organic semiconductor, or any multilayer or other combination of these. In another embodiment of the present invention, the initial semiconductor structure is of a semiconductor-on-insulator (SOI), rather than of bulk silicon.

It will be apparent to those skilled in the art having regard to this disclosure that other modifications of the present invention, beyond the embodiments specifically described herein, can be made without departing from the spirit of the invention. For example, the semiconductor devices and layered structures described above can include additional optional layers and the methods for fabricating such devices and structures can include additional optional steps for depositing such layers. Accordingly, such modifications are considered within the scope of the present invention as limited solely by the appended claims.

What is claimed is:

1. A method for modulating a plurality of gate lengths of a nanowire transistor device structures, the method comprising:
   providing a first stack of materials and a second stack of materials, wherein each stack of materials comprises a substrate layer, an insulator layer disposed on the substrate layer, and a sacrificial layer disposed on the insulator layer;
   removing a portion of the sacrificial layer of only the first stack of materials to form a partially recessed surface within the sacrificial layer, wherein a depth that the partially recessed surface is etched to determines a channel length;
   forming, on the sacrificial layer of the first stack of materials and the second stack of materials, a semiconductor layer having an upper section on the second stack of materials and a recessed section on the first stack of materials;
   removing portions of the semiconductor layer on the first stack of materials and the second stack of materials to form crossing sections and a plurality of depressed regions;
   removing portions of the sacrificial layer under the semiconductor layer of the first stack of materials and the second stack of materials to form undercuts;
   forming nanowires from the crossing sections of the semiconductor layer; and
   patterning tapered gate stacks within the undercuts such that the tapered gate stacks are disposed around a portion of the nanowires.

2. The method according to claim 1, the method further comprising:
   using a same patterned gate stack to form a second nanowire of a different channel length.

3. The method according to claim 1, wherein:
   the sacrificial layer includes a top surface; and
   a distance between the top surface of the sacrificial layer and the insulator layer is greater than the distance between the recessed surface and the insulator layer.

4. The method according to claim 1, wherein the substrate layer is of Silicon.

5. The method according to claim 1, wherein the sacrificial layer is of Silicon Germanium.

6. The method according to claim 1, wherein the insulator layer is of Silicon Oxide.

7. A method for modulating a plurality of gate lengths of nanowire transistor device structures, the method comprising:
   providing a first stack of materials and a second stack of materials, wherein each stack of materials comprises a substrate layer, an insulator layer disposed on the substrate layer, and a semiconductor layer disposed on the insulator layer;
   removing a portion of a top surface of the semiconductor layer of the first stack of materials and the second stack of materials to form a crossing section and a plurality of depressed regions;
   removing a portion of the insulator layer under a top surface of the semiconductor layer of the first stack of materials to form a first step that extends from the semiconductor layer to a first depth within the insulator layer, wherein the first depth that the first step is etched to determines a first channel length, and removing a portion of the insulator layer under a top surface of the semiconductor layer of the second stack of materials to form a second step that extends from the semiconductor layer to a second depth within the insulator layer, wherein the second depth that the second step is etched determines a second channel length, the first channel length being greater than the second channel length;
   forming a first nanowire from the crossing section of the semiconductor layer of the first stack of materials and a second nanowire from the crossing section of the semiconductor layer of the second stack of materials; and
   patterning a first tapered gate stack on the first step such that the first tapered gate stack is disposed around a portion of the first nanowire, and using a same patterned gate stack to form a second tapered gate stack on the second step such that the second tapered gate stack is disposed around a portion of the second nanowire.

8. The method according to claim 7, wherein the substrate layer is of Silicon.

9. The method according to claim 7, wherein the insulator layer is of Silicon Oxide.

10. The method according to claim 7, wherein the semiconductor layer is of Silicon.

11. The method according to claim 7, wherein the insulator layer is of high-density plasma oxide.

12. A method for modulating a plurality of gate lengths of a plurality of nanowire transistor device structures, the method comprising:
   providing a plurality of stacks of materials, wherein a stack of materials comprises a substrate layer, an insulator layer disposed on the substrate layer, and a sacrificial layer disposed on the insulator layer;
   removing a portion of the sacrificial layer to form a partially recessed surface within the sacrificial layer, wherein a depth that the partially recessed surface is etched to determines a channel length;
   forming, on the sacrificial layer, a semiconductor layer having an upper section and a recessed section, the upper section and the recessed section arranged directly on the partially recessed surface of the sacrificial layer;

removing a portion of the recessed section of the semiconductor layer to form a crossing section and a plurality of depressed regions;

removing a portion of the sacrificial layer under the recessed section of the semiconductor layer to form an undercut;

forming a nanowire from the crossing section of the semiconductor layer;

forming a tapered gate stack within the undercut such that the tapered gate stack is disposed around a portion of the nanowire; and using a same patterned gate stack to form a second nanowire of a different channel length.

13. The method according to claim 12, wherein the substrate layer is of Silicon.

14. The method according to claim 12, wherein the sacrificial layer is of Silicon Germanium.

15. The method according to claim 12, wherein the insulator layer is of Silicon Oxide.

* * * * *